United States Patent [19]

Tsuchimoto et al.

[11] Patent Number: 5,091,338

[45] Date of Patent: Feb. 25, 1992

[54] PROCESS FOR FORMING HEAT RESISTANT OHMIC ELECTRODE

[75] Inventors: Junichi Tsuchimoto; Tooru Yamada, both of Yokohama; Takaya Miyano, Kobe, all of Japan

[73] Assignee: Sumitomo Electric Industries, Ltd., Japan

[21] Appl. No.: 512,360

[22] Filed: Apr. 23, 1990

Related U.S. Application Data

[62] Division of Ser. No. 365,521, Jun. 13, 1989, Pat. No. 4,989,065.

[30] Foreign Application Priority Data

Jun. 13, 1988 [JP] Japan ................................ 63-144996
Dec. 23, 1988 [JP] Japan ................................ 63-325485

[51] Int. Cl.$^5$ ............................................. H01L 21/44
[52] U.S. Cl. ..................................... 437/184; 437/202; 148/DIG. 56; 148/DIG. 58
[58] Field of Search ............... 437/184, 189, 196, 202; 148/DIG. 20, DIG. 56, DIG. 58, DIG. 59

[56] References Cited

PUBLICATIONS

Marshall et al, "Nonalloyed Ohmic Contact to n-GaAs by Solid-Phase Epitaxy of Ge", 1 Aug. 87, J. Appl. Phys., vol. 62, pp. 942–947.
Pearton et al, Abstract #A87016601.
Wolf et al, Silicon Processing for the VLSI Era, 1986, pp. 57–58.

Primary Examiner—Brian E. Hearn
Assistant Examiner—C. Chaudhari
Attorney, Agent, or Firm—Beveridge, DeGrandi & Weilacher

[57] ABSTRACT

This invention comprises a Pd layer formed on an n-type GaAs semiconductor crystals, and a Ge layer being formed on the Pd layer, characterized in that the thickness of the Pd layer is between 300 Å and 1500 Å and the thickness of the Ge layer is between 500 Å and 1500 Å.

In addition, this invention provides an ohmic electrode forming process for compound semiconductor crystals for forming an ohmic electrode on an n-type GaAs semiconductor crystal, comprising a first layer forming step for forming a palladium (pd) layer on a compound semiconductor crystal; a second layer forming step for forming a germanium layer (Ge) on the Pd layer; and an annealing step for annealing the Pd layer and the Ge layer by a rapid thermal annealing treatment.

The Pd layer is formed between 300 Å and 1500 Å in the first layer forming step; the Ge layer is between 500 Å and 1500 Å in the second layer forming step; and the Pd layer and the Ge layer are heated in the annealing step for 3 seconds to 20 seconds at a temperature of 500° C. to 650° C. by a rapid thermal annealing treatment. As the rapid thermal annealing treatment, the flash annealing treatment is effective.

14 Claims, 12 Drawing Sheets

GaAs/Pd/Ge

GaAs/AuGe/Ni

PROCESS FOR FORMING HEAT RESISTANT OHMIC ELECTRODE

This application is a division of application Ser. No. 07/365,521, filed June 13, 1989 now U.S. Pat. No. 4,989,065.

BACKGROUND OF THE INVENTION

1. Field of the Invention

This invention relates to an ohmic electrode formed on an n-type GaAs semiconductor crystals and an ohmic electrode forming process thereof.

2. Related Background Art

The ohmic electrode forming technique is one process for forming electrodes on compound semiconductor crystals. An ohmic contact is formed by contacting a metal to a semiconductor in the case (1) where the recombination velocity of carriers at the interface is very high, in the case (2) where the Schottky barrier is low enough, and in the case (3) where the barrier is thin enough for carriers to tunnel (The Institute of Electronics Information and Communication Engineers, LSI Handbook, p. 710). The most popular process for forming such ohmic contact is alloyed ohmic contact. Of ohmic electrodes, Au-Ge-Ni electrode is most familiarly used.

Figure 1:
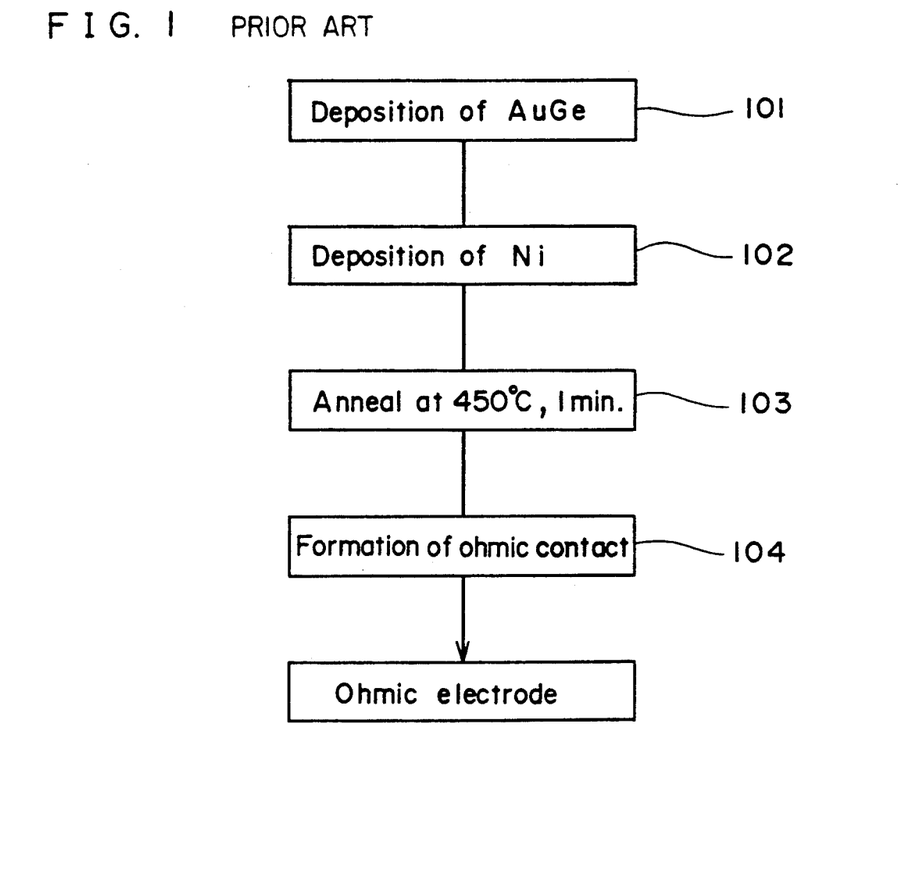
FIG. 1 is a flow chart of the conventional process for forming ohmic electrodes.

FIG. 1 shows the conventional process for forming ohmic Au-Ge-Ni electrodes. As described above, the conventional ohmic electrode comprises a two layer structure of an AuGe layer and an Ni layer formed on a substrate in this order. This process will be explained below. Firstly, an AuGe layer 2 is vacuum evaporated on a GaAs substrate 1 as a compound semiconductor (Step 101). An Ni layer 3 is vacuum evaporated on the AuGe layer 2 (Step 102). Then the AuGe layer 2 and the Ni layer 3 formed in these steps are heated at 450° C. in 1 minute (Step 104) to form an ohmic contact (Step 104), and an ohmic electrode 4 comprising AuGe/Ni is formed.

In addition, there is a case in which palladium (Pd) and germanium (Ge) are used as materials for forming electrodes (J. Appl. Phys. 62(3), 1 Aug. 1987, pp. 942 to 947). In the electrode forming process for this case, a Pd layer is formed and then a Ge layer is formed. The whole is annealed at 325° C. for 30 minutes.

Since semiconductor crystals are generally used in many fields, ohmic electrodes are used in various environments. But the conventional ohmic electrode has poor resistance for heat history. For example, a change in a temperature of an environment increases the contact resistance, with a result of malfunctions of semiconductor crystals. Accordingly, the conventional ohmic electrode has no sufficient reliability.

Especially, the Au-Ge-Ni electrode requires more complicated alloying steps as devices are more miniaturized and is not suitable for LSI, which needs complexity. It often happens that the electrodes are deformed, and the interfaces between the semiconductor crystals and the electrodes become uneven. This results in problems of short circuits of the electrodes, and that disuniform transistor characteristics are induced with increasing complexity of the devices. In the case where GaAs is used as a compound semiconductor, there is a problem with reliability due to rapid diffusion of Au in GaAs, and a problem is that since the alloying of Au-Ge is effective deep, Au-Ga eutectic mixture having a low eutectic point is formed with a result of poor resistance for heat history (semiconductors Handbook Editors Committee, Semiconductors Handbook, 2nd Edition, p. 366).

Problems of the process for Pd-Ge electrode have not been discussed at all. However, since the annealing temperature is not high, in the case, for example, where an ohmic electrode is formed and then a gate electrode or others is formed, the heat is raised above the described temperature, with a result of deterioration of their characteristics due to the heat history.

SUMMARY OF THE INVENTION

An object of this invention is to provide an ohmic electrode having high reliability against temperature history.

And the other object of this invention is to provide an electrode forming process which causes no short circuit of the resultant electrodes and makes the transistor characteristics uniform.

This invention comprises a Pd layer formed on an n-type GaAs semiconductor crystals, and a Ge layer being formed on the Pd layer, characterized in that the thickness of the Pd layer is between 300 Å and 1500 Å and the thickness of the Ge layer is between 500 Å and 1500 Å.

And this invention provides an ohmic electrode forming process for compound semiconductor crystals for forming an ohmic electrode on an n-type GaAs semiconductor crystals, comprising a first layer forming step for forming a Pd layer on a compound semiconductor crystal; a second layer forming step for forming a Ge layer on the Pd layer; and an annealing step for annealing the Pd layer and the Ge layer by a rapid thermal annealing treatment.

The Pd layer is formed between 300 Å and 1500 Å in the first layer forming step; the Ge layer is between 500 Å and 1500 Å in the second layer forming step; and the Pd layer and the Ge layer are heated in the annealing step for 3 to 20 seconds at a temperature of 500 Å to 650 Å by a rapid thermal annealing treatment. As the rapid thermal annealing treatment, the flash annealing treatment is effective.

The ohmic electrode according to this invention has the above described structure, which improves the resistance for heat history of the ohmic electrode and suppresses the heat history in high temperature condition.

And as the ohmic electrode forming process according to this invention has the annealing step of rapid thermal annealing treatment, the ohmic electrodes are free from the deformation caused by the annealing step and have even interfaces between the electrodes and compound semiconductor crystals.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 2:
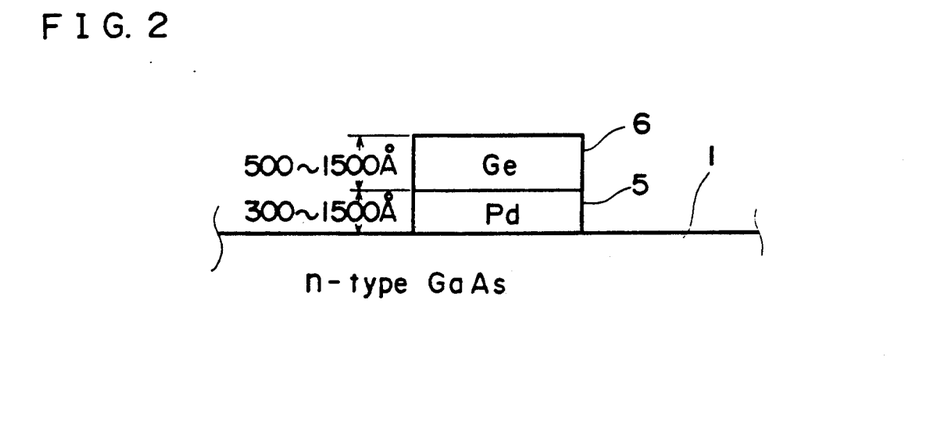
FIG. 2 is a sectional view of the ohmic electrode before annealing according to an embodiment of this invention.
Figure 3A:
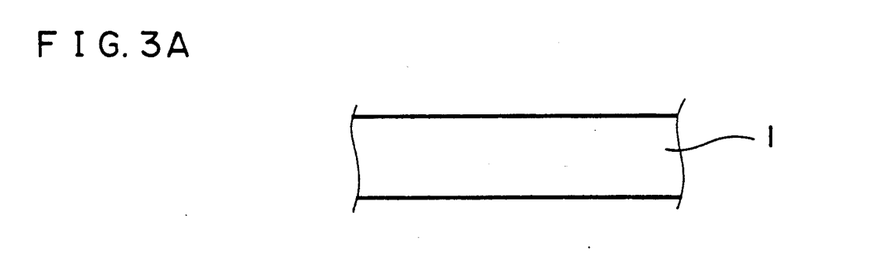
FIGS. 3A to 3D are process views for forming the ohmic electrode according to an embodiment of this invention.
Figure 3B:
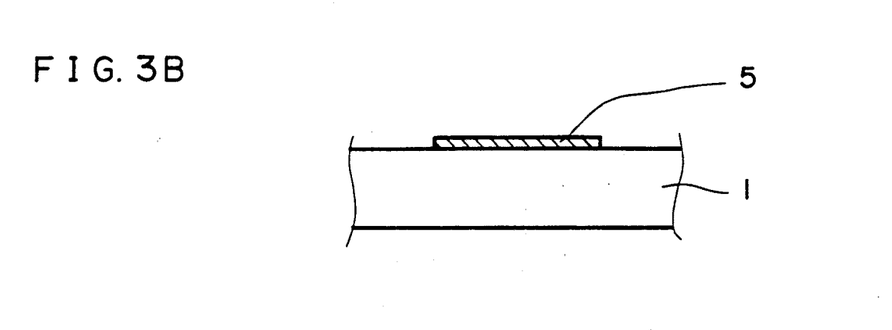
Figure 3C:
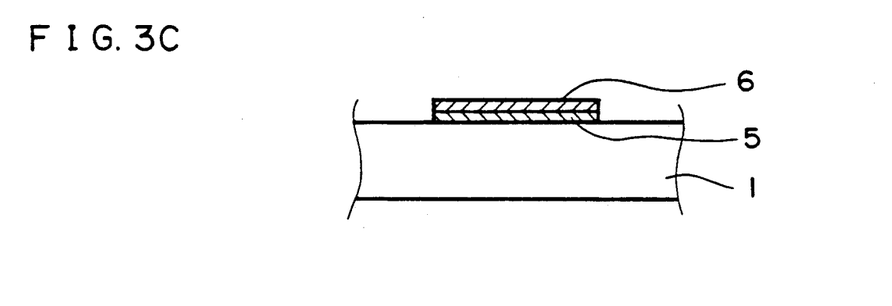
Figure 3D:
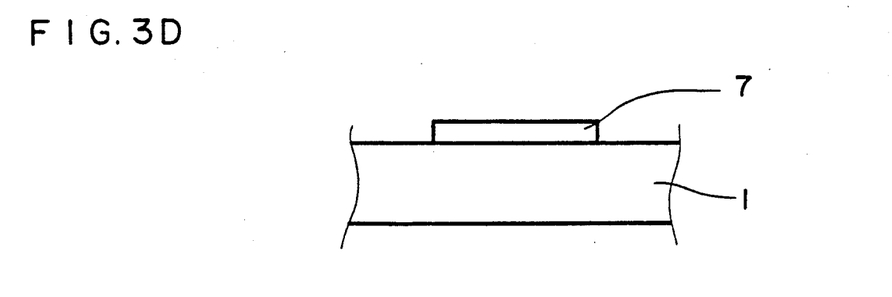
Figure 4:
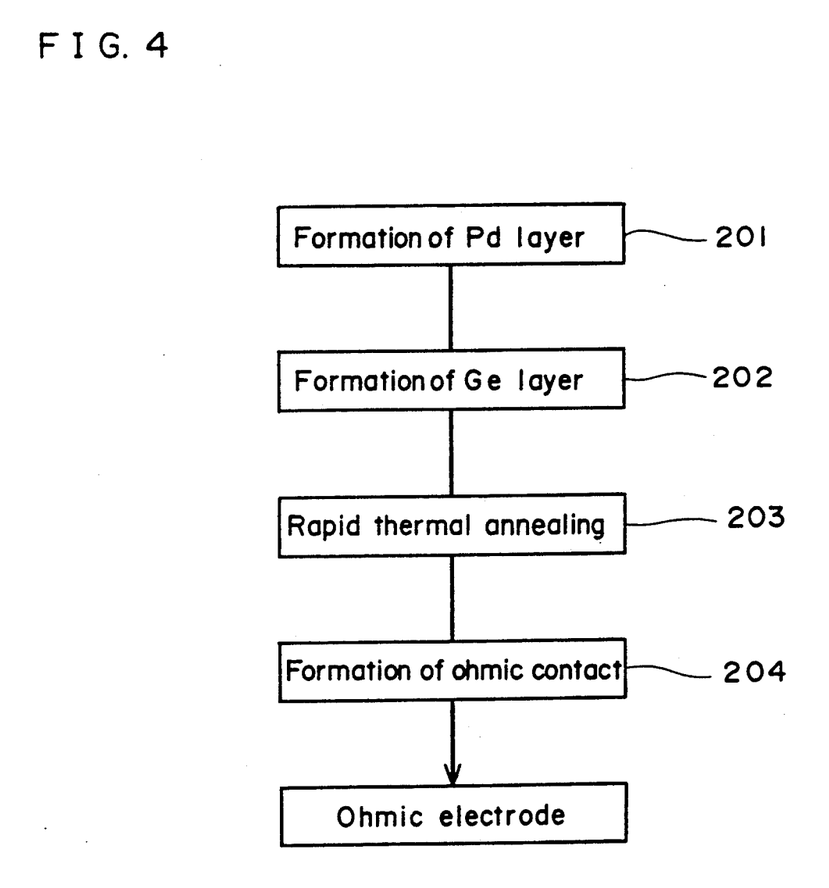
FIG. 4 is a flow chart of the process for forming the ohmic electrode according to an embodiment of this invention.

FIG. 2 shows the ohmic electrode according to one embodiment of this invention. This invention basically has a two layer structure comprising a Pd layer 5 and a Ge layer 6. The Pd layer is formed on an n-GaAs substrate 1 in a thickness of 300 Å to 1500 Å. On the Pd layer 5 is formed the Ge layer 6 in a thickness of 500 Å to 1500 Å.

FIGS. 3A to 3D and 4 show the process for forming the ohmic electrode according to this invention. This process comprises a first layer forming step, a second layer forming step and a annealing step. In the first layer forming step, the Pd layer is vacuum evaporated on the GaAs substrate 1 (Step 201).

In the second layer forming step, the Ge layer 6 is vacuum evaporated on the Pd layer 5 (Step 202). On the GaAs substrate 1, the electrode comprising a two layer structure of an Pd layer 5 and an Ge layer 6 in this order.

In the annealing step, the thus formed Pd layer and the Ge layer are annealed by Rapid Thermal Annealing (hereinafter referred as "RTA" treatment know for a annealing treatment of which annealing time is between 10 ns and 1 minute, especially used to make a shallow contact (The Institute of Electronics Information and Communication Engineers, LSI Handbook, p. 337) (Step 203). By this annealing step, an ohmic contact is formed (Step 204), and the ohmic electrode is formed. As described above, the resistance for heat history can be improved in use of RTA treatment. Further, the annealing step is performed in an inactive gas atmosphere, as of $N_2$ gas, Ar gas or others to prevent the oxidation of the annealing electrode.

Next, the ohmic electrode according to another embodiment of this invention will be explained. The different points in the above embodiment are to limit the thickness of Pd and Ge layers, the annealing temperature and time in the annealing step. The limitations are the thickness of the Pd layer as 300 Å to 1500 Å, that of the Ge layer as 500 Å to 1500 Å, the annealing temperature as 500° C. to 650° C., and the annealing time as 3 seconds to 20 seconds. There are no bad effects in the velocity of diffusion of Ge in RTA treatment where the thickness of the Pd layer is less than and equal to 1500 Å. And a Ge layer is formed on the GaAs substrate due to the excess of Ge in Pd-Ge composition where the thickness of the Ge layer is greater than or equal to 500 Å. Further, the contact resistance is low and the electrode surface becomes uniform and even where the annealing temperature is more than and equal to 500° C. and less than 650° C. and the annealing time is between 3 seconds and 20 seconds.

Figure 5:
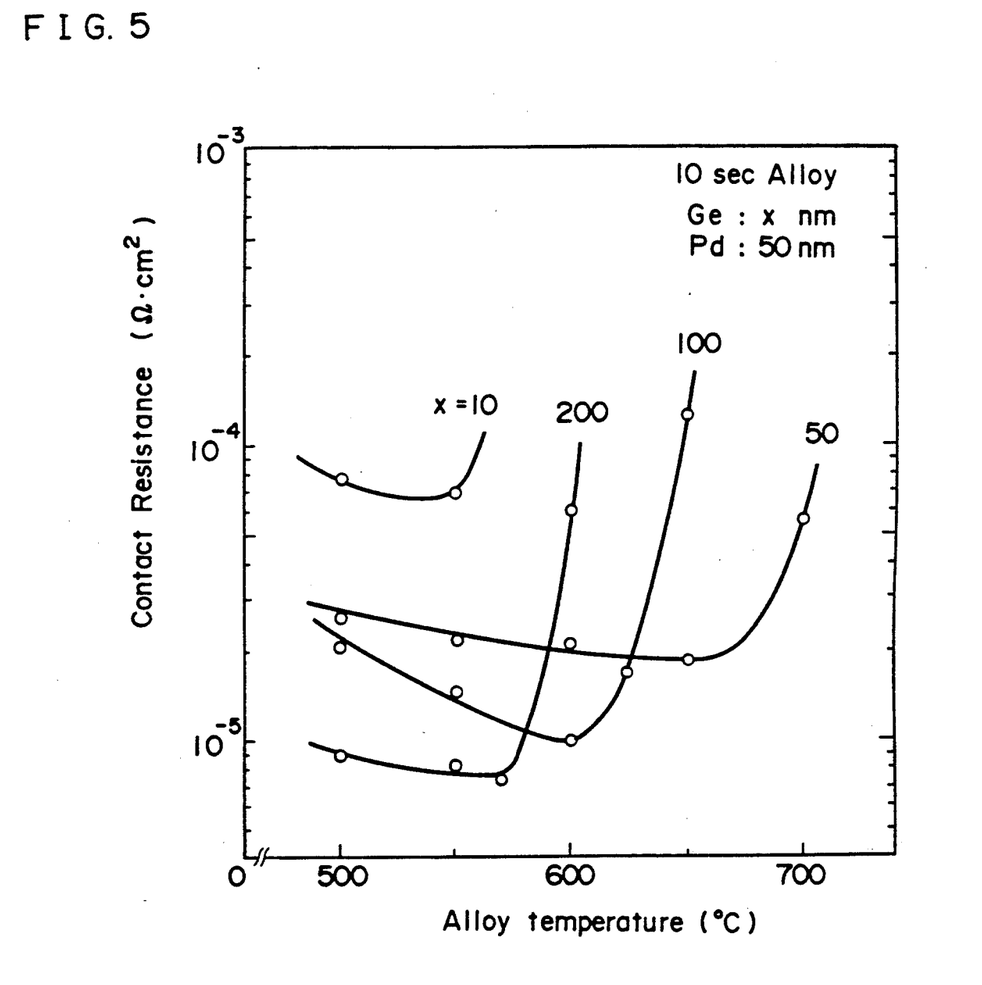
FIG. 5 is a graph showing the dependency of contact resistance on alloy temperature in annealing step of this invention.
Figure 6A:
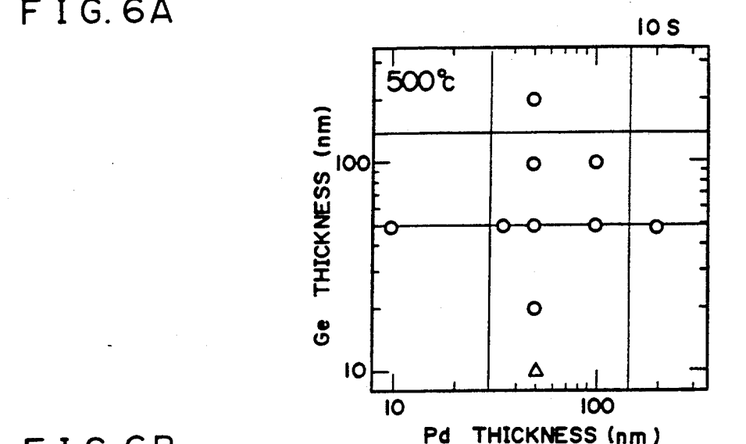
FIGS. 6A to 6E are the distribution diagrams in which the measurement data obtained in the experiment of FIG. 5 are classified into some regions and distinctively plotted according to the alloy temperature.
Figure 6B:
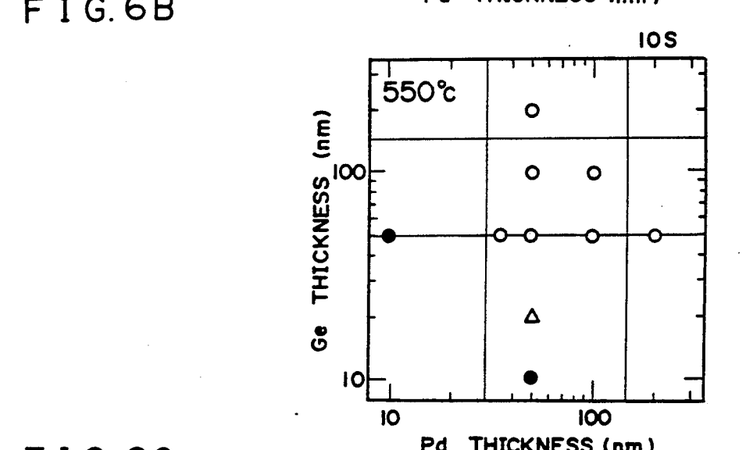
Figure 6C:
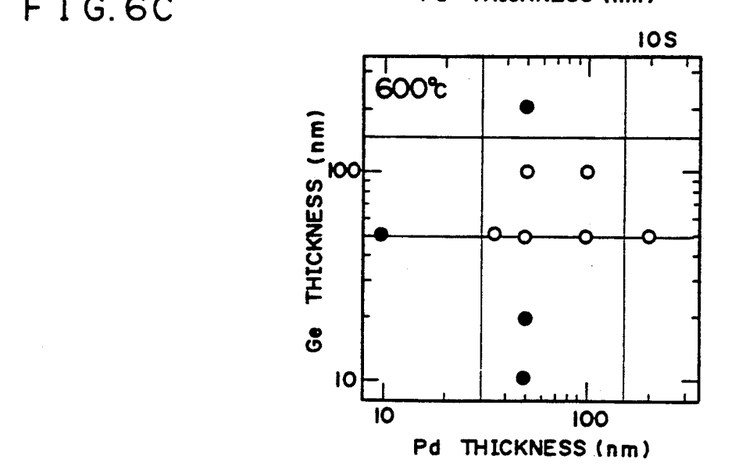
Figure 6D:
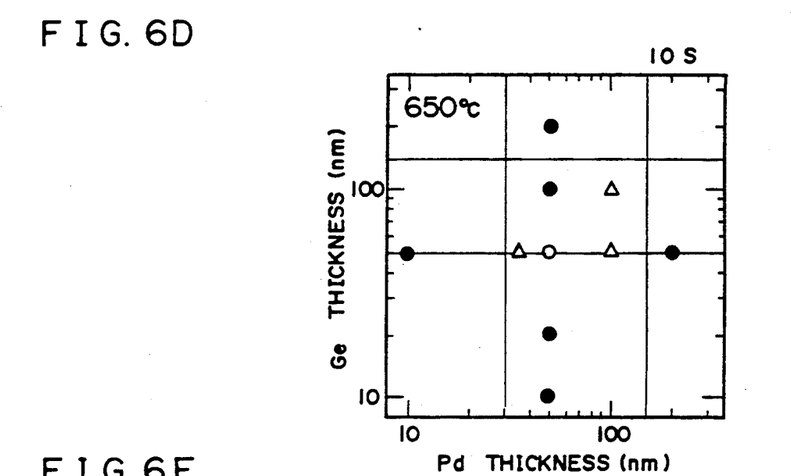
Figure 6E:
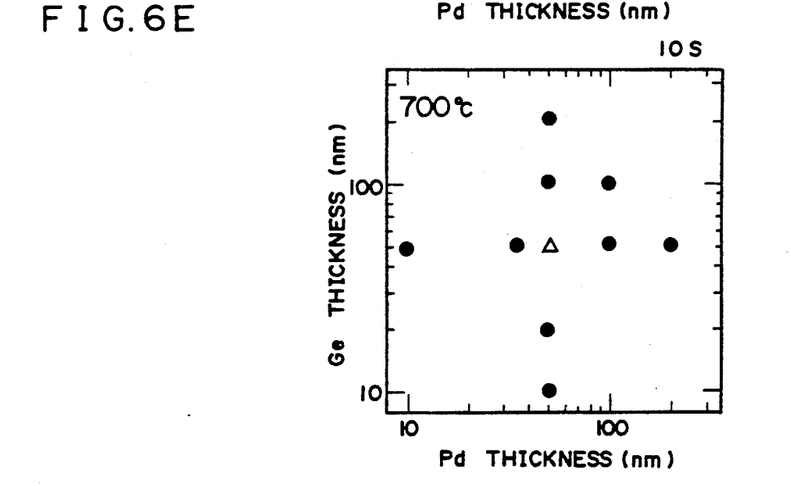

FIG. 5 shows dependency of contact resistance on alloy (annealing) temperature in the annealing step of the present invention. In this experiment, n-type GaAs substrate is used. And Pd layer is formed with the thickness of 50 nm and Ge layer is formed with the thicknesses of 10, 50, 100, 200 nm. Further, annealing time is 10 seconds and the annealing is made by the flash annealing treatment with tungsten (W) lamp. The annealing temperature is measured with AC thermocouple contacted on the wafer. According to the experiment, it is possible to classify into the stable region in which the contact resistance against the temperature is low and stable, the sudden change region in which the contact resistance against the temperature increases suddenly, and the impractical region in which the contact resistance is out of the practical range.

FIGS. 6A to 6E are the distribution diagrams in which the measurement data obtained in above experiment are classified into above regions and distinctively plotted according to the alloy temperature. In the figure, the data belonging to the stable region is represented by an open circle, the data belonging to the sudden change region is represented by a triangle point, the data belonging to the impractical region is represented by a closed circle. According to this diagram, it is apparent to obtain a good ohmic electrode where the thickness of Pd layer is between 30 nm to 150 nm, the thickness of the Ge layer is 50 nm to 150 nm, and annealing temperature is between 500° C. to 650° C.

Figure 7A:
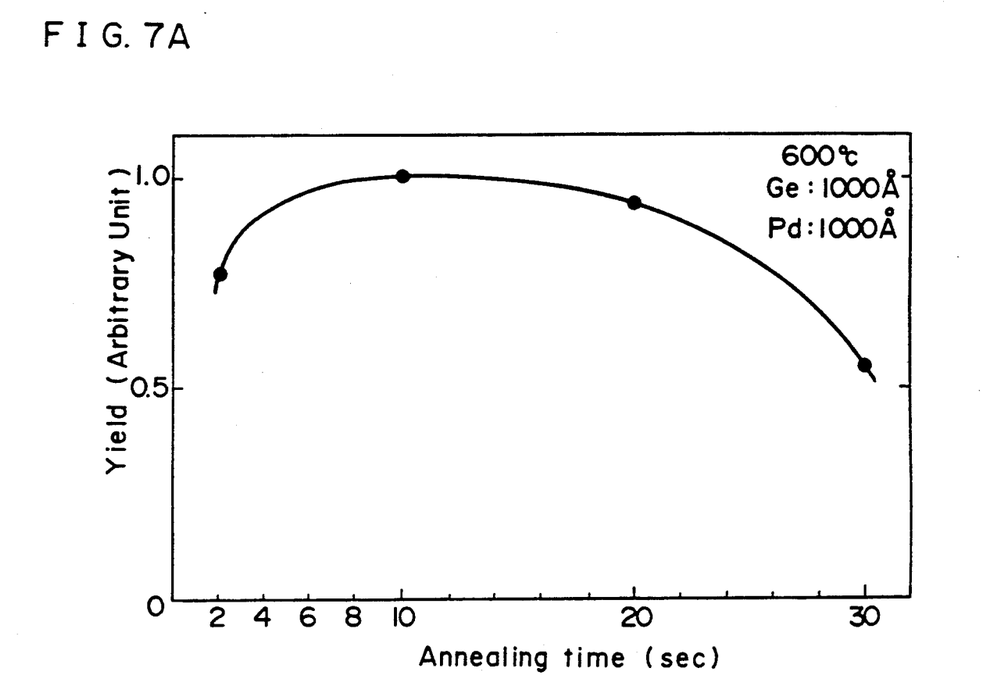
FIGS. 7A and 7B are graphs showing the relationships between annealing time, and yield in arbitrary unit.
Figure 7B:
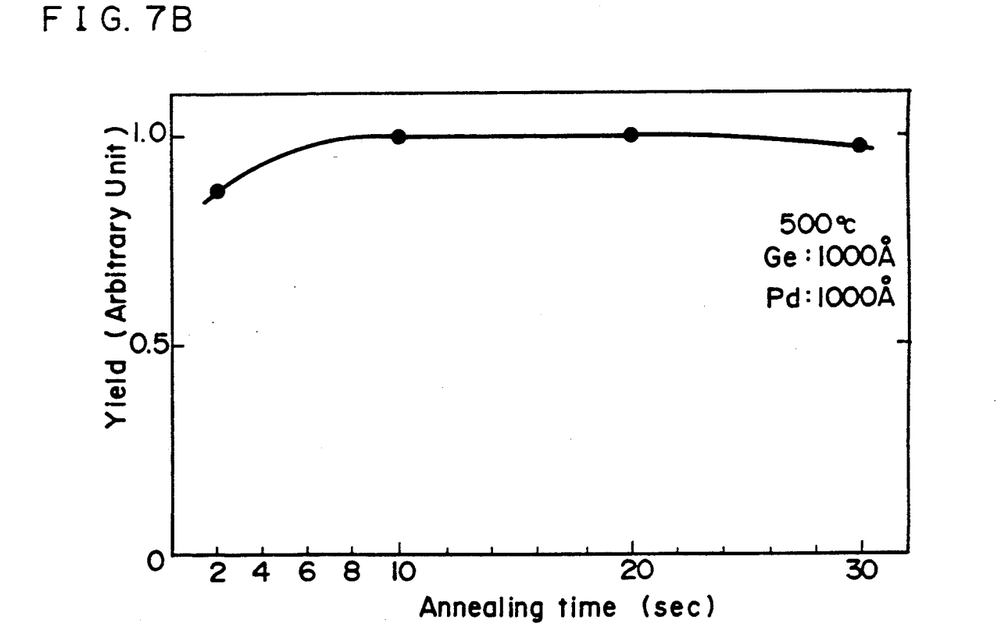

FIGS. 7A and 7B are the experimental results showing the relationships between annealing time and yield in arbitrary units for the electrode of which thicknesses of Ge and Pd are respectively 1000 Å. In this experiment, heat pulse 410 type (AG Associates co.) is used. FIG. 7A shows the result in the annealing temperature of 600° C., FIG. 7B shows the result in the annealing temperature of 500° C. In above results, it is apparent that the yield is preferable where the annealing time is between 3 seconds and 20 seconds.

Figure 8A:
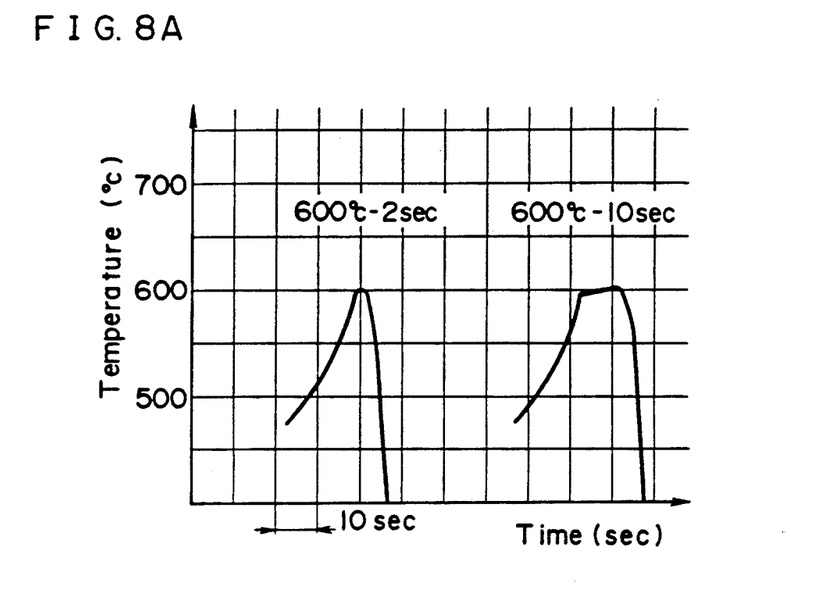
FIGS. 8A and 8B are graphs showing the relationships between annealing time and annealing temperature in the annealing step of the present invention.
Figure 8B:
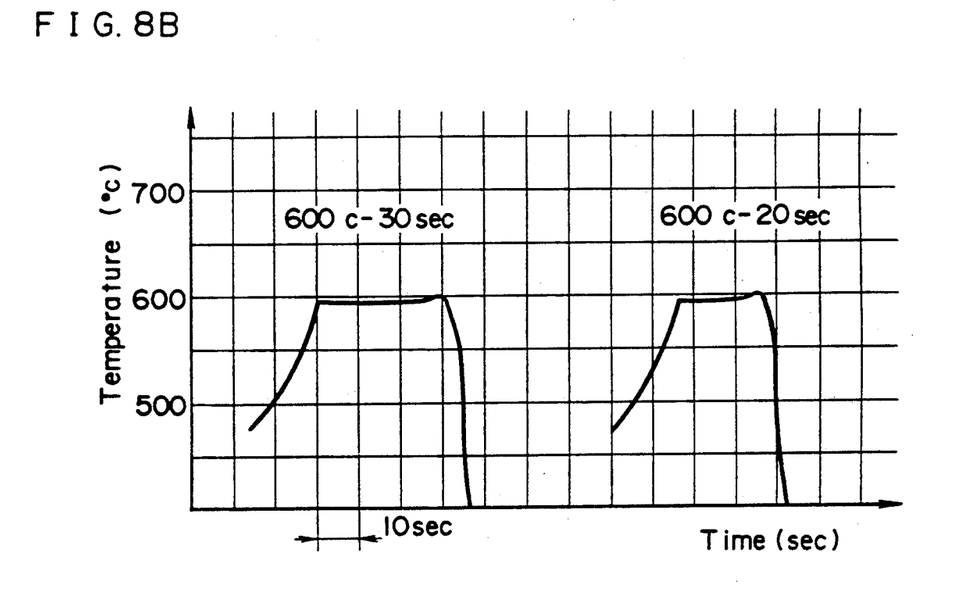

FIGS. 8A and 8B shows the relationships between annealing time and annealing temperature in the annealing step of the present invention with heat pulse 4100 type (AG Associates). In the result, temperature is gradually increased, and the desired temperature is held for certain time after the desired temperature is obtained. After that, the temperature is decreased suddenly. The annealing time of the embodiment means the time held at the desired temperature.

Figure 9A:
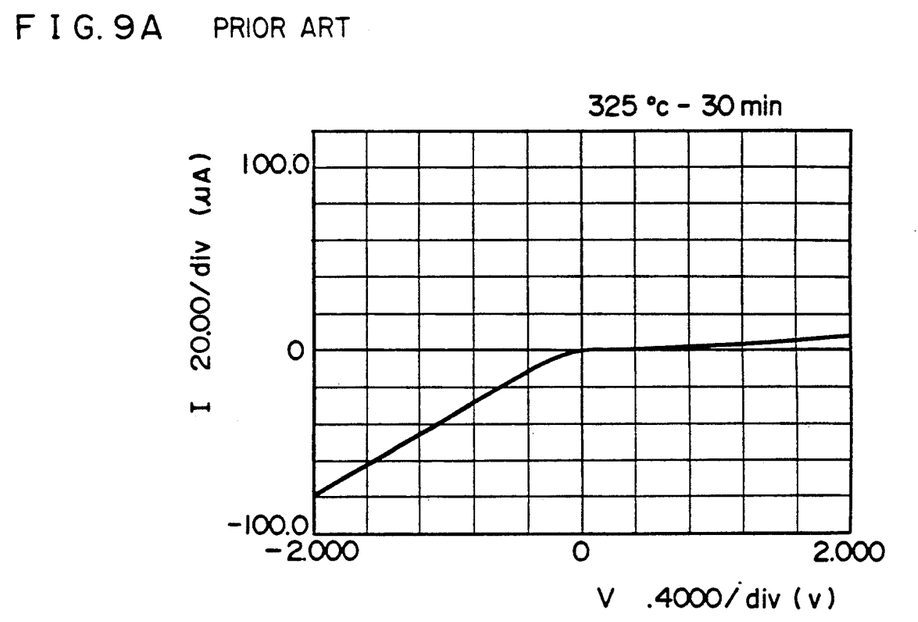
FIGS. 9A and 9B are graphs showing the resistance for heat history for ohmic electrode of related background art and the present invention in high temperature condition.
Figure 9B:
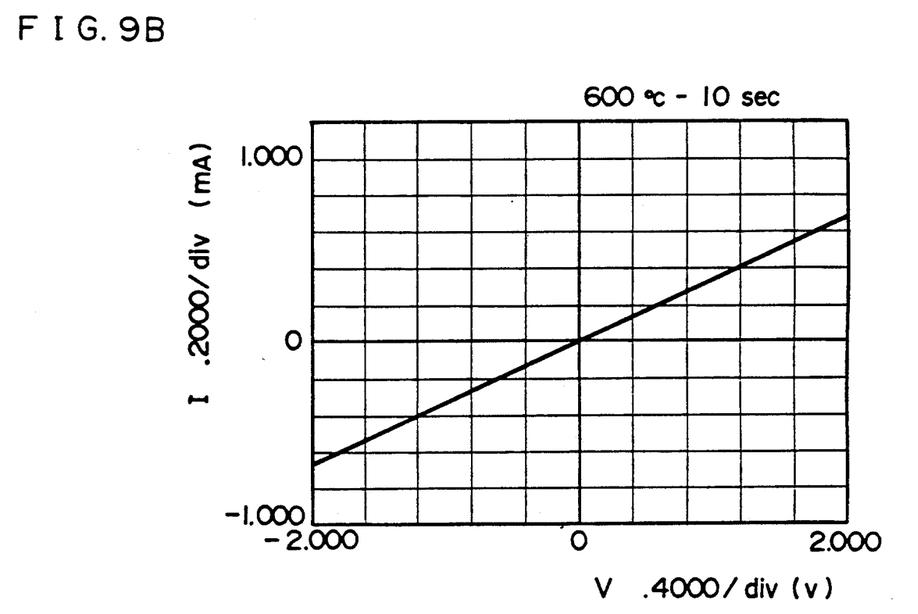

FIGS. 9A and 9B show the resistance for heat history for an ohmic electrode of related background art and the present invention in high temperature condition. FIG. 9A shows the characteristic for the ohmic electrode of related background art which is kept in a high temperature condition of 300° C. for 100 hours. This electrode is made after anneal of the Pd layer formed with the thickness of 1000 Å and the Ge layer formed with the thickness of 1000 Å on the Pd layer at 325° C. for 30 minutes. FIG. 9B shows characteristics between −2.0 and 2.0 volts for the ohmic electrode of the present invention which is kept in a temperature condition of 300° C. for 1000 hours. This electrode is made after rapid thermal anneal of the Pd layer formed with a thickness of 1000 Å and the Ge layer formed with a thickness of 1000 Å on the Pd layer at 600° C. for 10 seconds. The result is obtained in expression of applied voltage versus current in steps of 0.1V with the parameter analyzer HP4145B (Hewlett Packard). The ohmic electrode of related background art loses the ohmic characteristic only after 100 hours, but the ohmic electrode of the present invention does not lose the ohmic characteristic even after 1000 hours which is 10 times thereof.

Figure 10A:
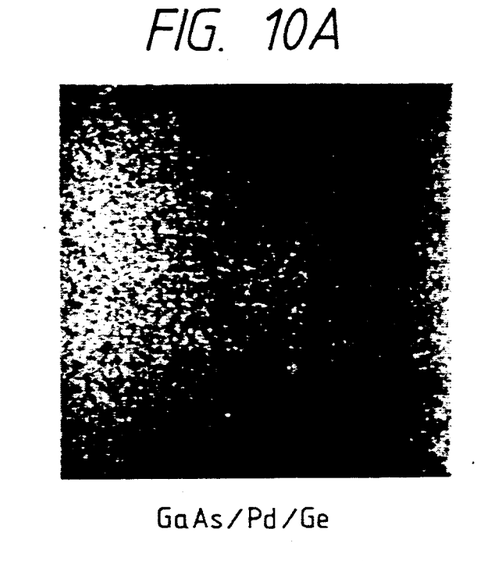
FIGS. 10A and 10B are photographs for Au-Ge-Ni electrode of the related background art and Pd-Ge electrode of the present invention.
Figure 10B:
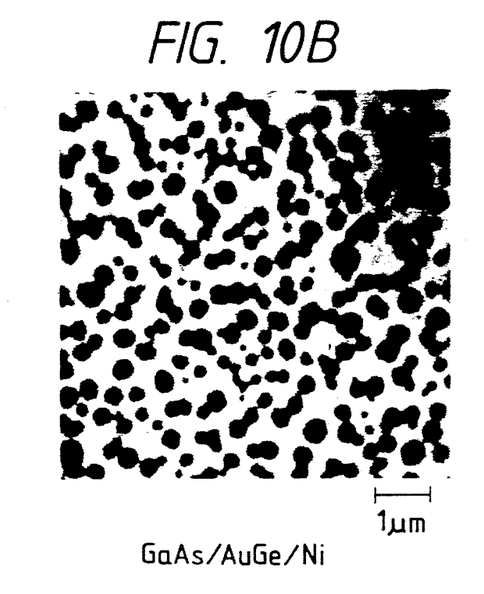

FIGS. 10A and 10B are photographs for Au-Ge-Ni electrode of the related background art and the Pd-Ge electrode of the present invention obtained in use of electron microscope. The surface of the Pd-Ge electrode is very smooth. On the other hand, that of the Au-Ge-Ni electrode is rough. Accordingly, the electrode of some microns has dispersion in contact resistance and the ohmic characteristic is not good. This Pd-Ge electrode is made after rapid thermal anneal of Pd layer formed with the thickness of 1000 Å and Ge layer formed with the thickness of 1000 Å on the Pd layer at 600° C. in 10 seconds.

Figure 11:
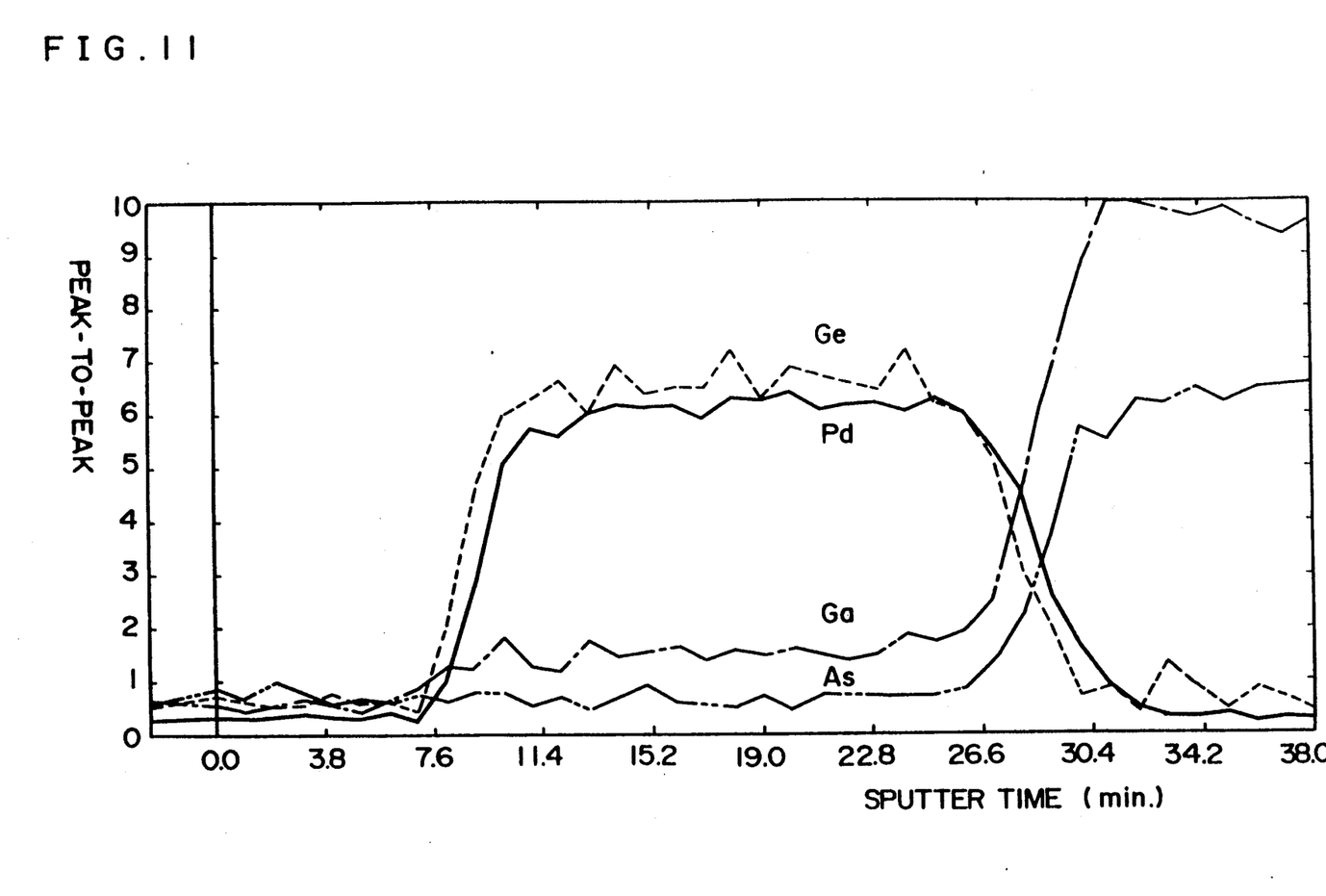
FIG. 11 is a graph showing the result of composition analysis in the depth profile by AES for Pd-Ge electrode of the present invention.

FIG. 11 shows the result of composition analysis in the depth profile by AES for Pd-Ge electrode of the present invention. It is understandable that Pd and Ge are fused as a whole in the electrode.

Figure 12:
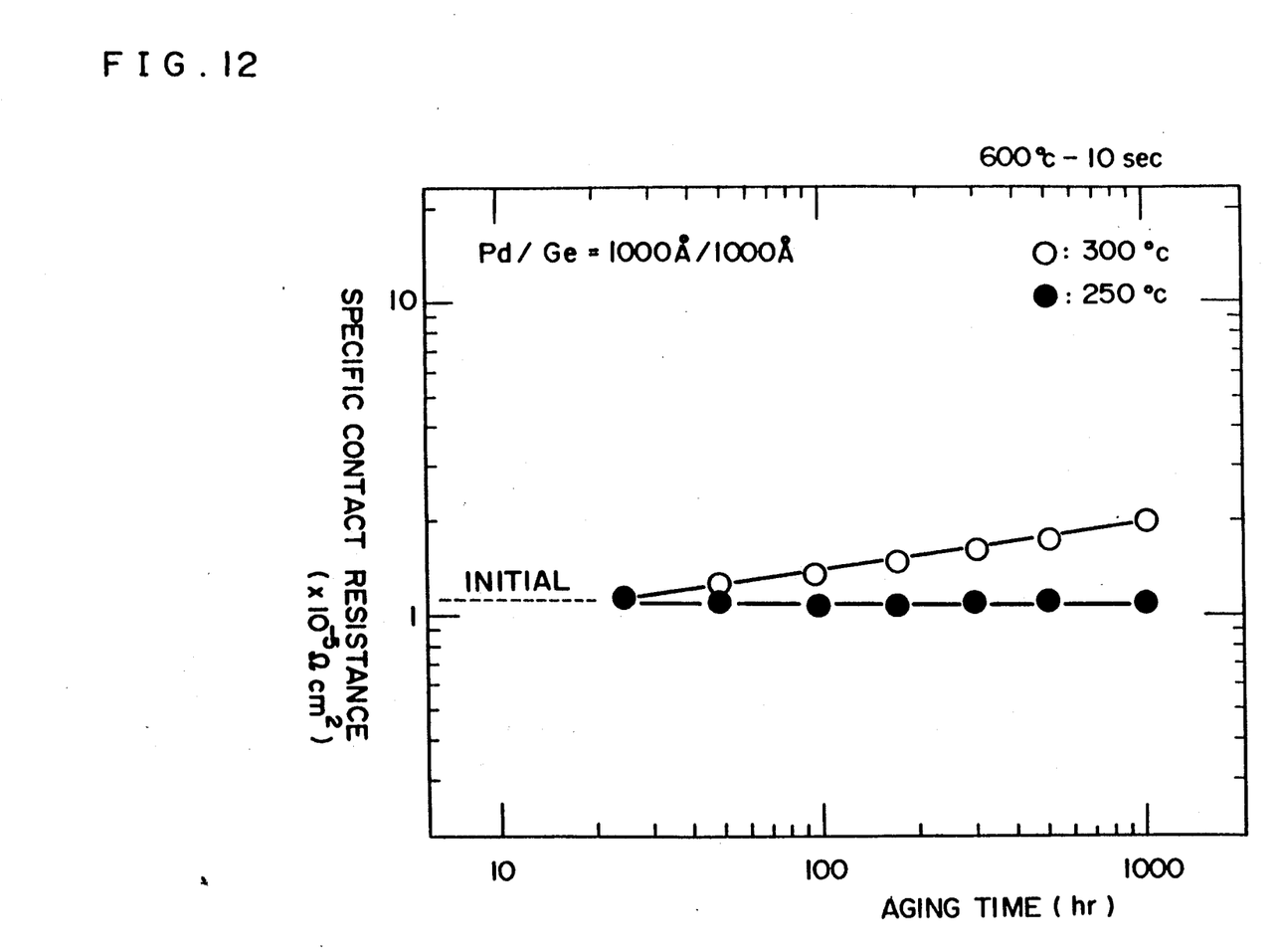
FIG. 12 is a graph showing the experimental result showing the contact resistance changes of Pd-Ge electrode of the present invention in the atmosphere of 250° C. and 300° C.

FIG. 12 is the experimental result showing the contact resistance changes of Pd-Ge electrode of the present invention in the atmosphere of 250° C. and 300° C. In this experiment, Pd-Ge electrode made after rapid thermal anneal of the Pd layer formed with a thickness of 1000 Å and Ge layer formed with a thickness of 1000 Å on the Pd layer at 600° C. in 10 seconds is used with the parameter analyzer HP4145B (Hewlett Packard). It is understandable that there is no change in contact resistance for the temperature of 250° C. and there was a little change even for the temperature of 300° C. Even in this case, the electrode shows an ohmic characteristic clearly (refer to FIG. 9B).

Lastly, the results of an experiment of this invention will be explained. In the first layer forming step, the Pd layer was formed in a thickness of 760 Å on the GaAs substrate, and in the second layer forming step, the Ge layer was formed in a thickness of 500 Å. In the annealing step, the heat treatment was performed at 600° for 10 seconds in the surrounding atmosphere of $N_2$. Following these steps, an ohmic electrode having a contact resistance of about $1 \times 10^{-5} \Omega \text{ cm}^2$ was formed.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. An ohmic electrode forming process for forming an ohmic electrode to provide an ohmic contact on an n-type GaAs semiconductor crystal, said process comprising the steps of:

providing a Pd layer directly on an n-type GaAs semiconductor crystal;

providing a Ge layer on the Pd layer; and annealing the Pd layer and the Ge layer by performing a rapid thermal annealing treatment wherein said layers are annealed between 3 seconds and 20 seconds at a temperature between 500° C. and 600° C. whereby said electrode continues to exhibit ohmic characteristics when it is kept in high temperature conditions at 300° C. for at least 100 hours.

2. An ohmic electrode forming process for n-type GaAs semiconductor crystals according to claim 1, wherein said Pd layer and said Ge layer are formed by vacuum evaporation.

3. An ohmic electrode forming process for n-type GaAs semiconductor crystals according to claim 1, wherein said annealing step is performed in an inactive gas atmosphere.

4. An ohmic electrode forming process for n-type GaAs semiconductor crystals according to claim 1, wherein said first layer providing step comprises providing a Pd layer having a thickness between 300 Å and 1500 Å on said semiconductor crystal;

said second layer providing step comprises providing a Ge layer having a thickness between 500 Å and 1500 Å on said Pd layer.

5. An ohmic electrode forming process for n-type GaAs semiconductor crystals according to claim 4, wherein said rapid thermal annealing treatment comprises a flash annealing treatment.

6. An ohmic electrode forming process for n-type GaAs semiconductor crystals according to claim 4, wherein said Pd layer is formed to have a thickness of about 760 Å, said Ge layer is formed to have a thickness of about 500 Å, and said Pd layer and said Ge layer are annealed at about 600° C. for about 10 seconds during said rapid thermal annealing treatment.

7. An ohmic electrode forming process for n-type GaAs semiconductor crystals according to claim 4, wherein said Pd layer is formed to have a thickness of about 1000 Å, said Ge layer is formed to have a thickness of about 1000 Å, and said Pd layer and said Ge layer are annealed at about 600° C. for about 10 seconds during said rapid thermal annealing treatment.

8. An ohmic electrode forming process for n-type GaAs semiconductor crystals according to claim 1, wherein said electrode continues to exhibit ohmic characteristics for at least 1,000 hours.

9. An ohmic electrode forming process for n-type GaAs semiconductor crystals according to claim 1, wherein said first layer providing step comprises providing a Pd layer having a thickness between 300 Å and 1500 Å on said semiconductor crystal.

10. An ohmic electrode forming process for n-type GaAs semiconductor crystals according to claim 1, wherein
said second layer providing step comprises providing a Ge layer having a thickness between 500 Å and 1500 Å on said Pd layer.

11. An ohmic electrode forming process for forming an ohmic electrode to provide an ohmic contact on an n-type GaAs semiconductor crystal, said process comprising the steps of:
providing a Pd layer directly on an n-type GaAs semiconductor crystal;
providing a Ge layer on the Pd layer; and
annealing the Pd layer and the Ge layer by performing a rapid thermal annealing treatment wherein said layers are annealed between 500° C. and 600° C. whereby said electrode continues to exhibit ohmic characteristics when it is kept in high temperature conditions at 300° C. for at least 100 hours.

12. An ohmic electrode forming process for n-type GaAs semiconductor crystals according to claim 11, wherein
said first layer providing step comprises providing a Pd layer having a thickness between 300 Å and 1500 Å.

13. An ohmic electrode forming process for n-type GaAs semiconductor crystals according to claim 11, wherein
said second layer providing step comprises providing a Ge layer having a thickness between 500 Å and 1500 Å.

14. An ohmic electrode forming process for n-type GaAs semiconductor crystals, according to claim 11, wherein
said first layer providing step comprises providing a Pd layer having a thickness between 300 Å and 1500 Å; and
said second layer providing step comprises providing a Ge layer having a thickness between 500 Å and 1500 Å.

* * * * *